United States Patent [19]
Kobayashi et al.

[11] Patent Number: 5,856,764
[45] Date of Patent: Jan. 5, 1999

[54] OSCILLATION CIRCUIT HAVING AN ACTIVE CIRCUIT PORTION AND A SURFACE ACOUSTIC WAVE RESONANCE DEVICE

[75] Inventors: Kozo Kobayashi, Kanagawa; Tadashi Imai, Chiba, both of Japan

[73] Assignee: Sony Corporation, Tokyo, Japan

[21] Appl. No.: 874,583

[22] Filed: Jun. 13, 1997

[30] Foreign Application Priority Data

Jun. 20, 1996 [JP] Japan .................................. 8-159795

[51] Int. Cl.$^6$ ................................ H03B 5/02; H03B 5/30
[52] U.S. Cl. ................................ 331/107 R; 331/107 DP; 331/117 R; 331/116 M; 331/36 C; 333/194
[58] Field of Search ........................... 331/107 R, 116 R, 331/107 DP, 117 R, 116 M, 36 C; 333/194

[56] References Cited

FOREIGN PATENT DOCUMENTS 40 3076306  4/1991  Japan .................................. 331/107 R

*Primary Examiner*—Arnold Kinkead
*Attorney, Agent, or Firm*—Frommer Lawrence & Haug, LLP; William S. Frommer; Dennis M. Smid

[57] ABSTRACT

An oscillation circuit comprises a surface acoustic wave resonance device of the single port type, an active circuit portion with which the surface acoustic wave resonance device is connected so that a signal feedback from the active circuit portion to the surface acoustic wave resonance device is carried out, an inductive element connected substantially in parallel with the surface acoustic wave resonance device, and a damping portion connected with one or both of the inductive element and the surface acoustic wave resonance device for suppressing parasitic oscillations caused by coaction between the inductive element and stray capacitance accompanying the surface acoustic wave resonance device.

4 Claims, 6 Drawing Sheets

OSCILLATION CIRCUIT HAVING AN ACTIVE CIRCUIT PORTION AND A SURFACE ACOUSTIC WAVE RESONANCE DEVICE

BACKGROUND OF THE INVENTION

1. Field of the Invention

The present invention relates generally to oscillation circuits, and is directed to an improvement in an oscillation circuit which comprises an active circuit portion and a surface acoustic wave resonance device of the single port type connected with the active circuit portion and in which a signal feedback from the active circuit portion to the surface acoustic wave resonance device of the single port type is carried out to raise an oscillating operation at an oscillation frequency determined in accordance with the resonance frequency of the surface acoustic wave resonance device of the single port type.

2. Description of the Prior Art

There has been proposed an oscillation circuit using a surface acoustic wave resonance device for producing an oscillation output signal having a frequency in the range of megahertz (MHz), for example, from tens to hundreds MHz. Surface acoustic wave resonance devices are classified into single port and double port types. A surface acoustic wave resonance device of the single port type is represented by means of an equivalent circuit shown in FIG. 1 and a surface acoustic wave resonance device of the double port type is represented by means of an equivalent circuit shown in FIG. 2.

The equivalent circuit representing the surface acoustic wave resonance device of the single port type as shown in FIG. 1 comprises a series connection of a resistant element 11, an inductive element 12 and a capacitive element 13 and a capacitive element 14 connected in parallel with the series connection of the resistant element 11, inductive element 12 and capacitive element 13 so as to correspond to a stray capacitance accompanying that series connection. The equivalent circuit representing the surface acoustic wave resonance device of the double port type as shown in FIG. 2 comprises a series connection of a resistant element 15, an inductive element 16 and a capacitive element 17, a couple of inductive elements 18 and 19 in which the inductive element 18 is connected in series with the series connection of the resistant element 15, the inductive element 16 and the capacitive element 17, a capacitive element 20 connected in parallel with the series connection of the resistant element 15, the inductive element 16, the capacitive element 17 and the inductive element 18 so as to correspond to a stray capacitance accompanying that series connection, and a capacitive element 21 connected in parallel with the inductive element 19 so as to correspond to a stray capacitance accompanying the inductive element 19.

As understood with the equivalent circuits shown in FIG. 1, the surface acoustic wave resonance device of the single port type can be treated in the same manner as a quartz resonator and therefore it is possible to form an oscillation circuit having a relatively simple structure with use of the surface acoustic wave resonance device of the single port type. In case of an oscillation circuit making use of the surface acoustic wave resonance device of the single port type, an active circuit portion including, for example, transistors and a signal feedback circuit is provided and both ends of the surface acoustic wave resonance device of the single port type are connected with the active circuit portion, so that a signal feedback from the active circuit portion to the surface acoustic wave resonance device of the single port type is carried out to raise an oscillating operation at an oscillation frequency determined in accordance with the resonance frequency of the surface acoustic wave resonance device of the single port type.

However, since the surface acoustic wave resonance device of the single port type is subjected to a harmful influence of stray capacitance to a larger extent more than the surface acoustic wave resonance device of the double port type, it may be difficult for an oscillation circuit having a fundamental structure comprising an active circuit portion and a surface acoustic wave resonance device of the single port type connected with the active circuit portion to oscillate properly at a relatively high frequency range. Accordingly, it is usual, for the oscillation circuit having the fundamental structure comprising the active circuit portion and the surface acoustic wave resonance device of the single port type connected with the active circuit portion, to oscillate at a relatively low frequency range such as, for example, at the frequency range from 40 to 300 MHz.

Assuming in the equivalent circuit shown in FIG. 1, R represents the resistance of the resistant element 11, L represents the inductance of the inductive element 12, C represents capacitance of the capacitive element 13, Cs represents the capacitance of the capacitive element 14, namely, a stray capacitance, and Fo represents the resonance frequency of the surface acoustic wave resonance device of the single port type, namely, an oscillation frequency, under a condition in which the stray capacitance Cs is so small as to be substantially negligible, a value Q which indicates sharpness in resonance of the surface acoustic wave resonance device of the single port type is shown by the following equations.

$$Q = Z/R$$

$$Z = 2 \cdot \pi \cdot Fo \cdot L - 1/(2 \cdot \pi \cdot Fo \cdot C)$$

The oscillation circuit comprising the active circuit portion and the surface acoustic wave resonance device of the single port type connected with the active circuit portion is operative to oscillate when Z has a positive value. In the oscillation circuit comprising the active circuit portion and the surface acoustic wave resonance device of the single port type connected with the active circuit portion and put in its oscillating operation, Z increases monotonously in response to increase in the oscillation frequency and the value Q also increases monotonously.

To the contrary, under a condition in which the stray capacitance Cs is so large as not to be substantially neglected, the oscillation frequency is reduced to be lower than the resonance frequency Fo of the surface acoustic wave resonance device of the single port type which is obtained under the condition in which the stray capacitance Cs is so small as to be substantially negligible and the value Q indicating sharpness in resonance of the surface acoustic wave resonance device of the single port type is also reduced to be lower than that under the condition in which the stray capacitance Cs is so small as to be substantially negligible. That is, the effective value of the value Q indicating sharpness in resonance of the surface acoustic wave resonance device of the single port type is reduced due to the harmful influence of the stray capacitance, and therefore, the oscillation circuit comprising the active circuit portion and the surface acoustic wave resonance device of the single port type connected with the active circuit portion may be unable to oscillate properly at the relatively high frequency range. Consequently, the oscillation circuit proposed previously to have the fundamental structure comprising the active circuit portion and the surface acoustic wave resonance device of the single port type connected with the active circuit portion is accompanied with a disadvantage or problem that an oscillation output signal at the relatively high frequency can not be obtained.

OBJECTS AND SUMMARY OF THE INVENTION

Accordingly, it is an object of the present invention to provide an oscillation circuit having a relatively simple structure which comprises an active circuit portion and a surface acoustic wave resonance device of the single port type connected with the active circuit portion, which avoids the aforementioned disadvantage or problem encountered with the prior art.

Another object of the present invention is to provide an oscillation circuit having a relatively simple structure which comprises an active circuit portion and a surface acoustic wave resonance device of the single port type connected with the active circuit portion, in which a harmful influence of stray capacitance exerted upon the surface acoustic wave resonance device of the single port type is effectively suppressed.

A further object of the present invention is to provide an oscillation circuit having a relatively simple structure which comprises an active circuit portion and a surface acoustic wave resonance device of the single port type connected with the active circuit portion, in which a harmful influence of stray capacitance exerted upon the surface acoustic wave resonance device of the single port type is effectively suppressed and therefore an oscillation output signal at a relatively high frequency, such as a frequency equal to or higher than, for example, 450 MHz, can be surely and stably obtained.

A still further object of the present invention is to provide an oscillation circuit having a relatively simple structure which comprises an active circuit portion and a surface acoustic wave resonance device of the single port type connected with the active circuit portion, which is suitable for being associated with an integrated circuit device and able to be obtained on the cheap.

According to the present invention, there is provided an oscillation circuit comprising a surface acoustic wave resonance device of the single port type, an active circuit portion with which the surface acoustic wave resonance device of the single port type is connected so that a signal feedback from the active circuit portion to the surface acoustic wave resonance device of the single port type is carried out, an inductive portion connected substantially in parallel with the surface acoustic wave resonance device of the single port type, and a damping portion connected with one or both of the inductive portion and the surface acoustic wave resonance device of the single port type for suppressing parasitic oscillations caused by coaction between the inductive means and stray capacitance accompanying the surface acoustic wave resonance device of the single port type.

The active circuit portion is provided with circuit parameters determined, for example, in such a manner as to oscillate when the surface acoustic wave resonance device of the single port type provides inductive impedance and the damping portion comprises, for example, a resistant portion connected in series with the inductive portion or a resistant portion connected in series with the surface acoustic wave resonance device of the single port type.

In the oscillation circuit thus constituted in accordance with the present invention, under a condition in which the signal feedback of a signal having a frequency in the vicinity of a resonance frequency of the surface acoustic wave resonance device of the single port type is carried out from the active circuit portion to the surface acoustic wave resonance device of the single port type, the circuit structure captured by means of observation from the active circuit portion toward the surface acoustic wave resonance device of the single port type comprises the surface acoustic wave resonance device of the single port type and the inductive portion connected in parallel with the surface acoustic wave resonance device of the single port type and other portions including the damping portion are neglected. Accordingly, the stray capacitance accompanying the surface acoustic wave resonance device of the single port type is substantially cancelled by the inductive portion, and therefore, reduction in an effective value of a value Q indicating sharpness in resonance of the surface acoustic wave resonance device of the single port type is effectively prevented from being caused due to a harmful influence of the stray capacitance. Consequently, the resonance frequency of the surface acoustic wave resonance device of the single port type, namely, the oscillation frequency of the oscillation circuit can be set to be a relatively high frequency, so that an oscillation output signal having a relatively high frequency, such as a frequency equal to or higher than, for example, 450 MHz can be obtained.

On the other hand, under a condition in which the signal feedback of the signal having the frequency in the vicinity of the resonance frequency of the surface acoustic wave resonance device of the single port type is not carried out from the active circuit portion to the surface acoustic wave resonance device of the single port type, the damping portion comprising, for example, the resistant portion connected in series with the inductive portion or the resistant portion connected in series with the surface acoustic wave resonance device of the single port type can not be substantially neglected, so that the circuit structure captured by means of observation from the active circuit portion toward the surface acoustic wave resonance device of the single port type comprises the surface acoustic wave resonance device of the single port type, the inductive portion connected with the surface acoustic wave resonance device of the single port type and the damping portion. Accordingly, the parasitic oscillations arising at an undesirable resonance frequency determined by inductance of the inductive portion and the stray capacitance accompanying the surface acoustic wave resonance device of the single port type are effectively suppressed by the damping portion.

As described above, in the oscillation circuit according to the present invention, the inductive portion connected substantially in parallel with the surface acoustic wave resonance device of the single port type is operative to cancel substantially the stray capacitance accompanying the surface acoustic wave resonance device of the single port type under the condition in which the signal feedback of the signal having the frequency in the vicinity of the resonance frequency of the surface acoustic wave resonance device of the single port type is carried out from the active circuit portion to the surface acoustic wave resonance device of the single port type, and the damping portion connected with one or both of the inductive portion and the surface acoustic wave resonance device of the single port type is operative to suppress the parasitic oscillations arising at the undesirable resonance frequency under the condition in which the signal feedback of the signal having the frequency in the vicinity of the resonance frequency of the surface acoustic wave resonance device of the single port type is not carried out from the active circuit portion to the surface acoustic wave resonance device of the single port type. As a result, the oscillation output signal having the relatively high frequency, for example, the frequency equal to or higher than 450 MHz can be surely and stably obtained.

Further, the oscillation circuit according to the present invention has a relatively simple fundamental structure which comprises the active circuit portion and the surface acoustic wave resonance device of the single port type connected with the active circuit portion, and therefore, is suitable for being associated with an integrated circuit device and able to be cheaply obtained.

The above, and other objects, features and advantages of the present invention will become apparent from the following detailed description taken in conjunction with the accompanying drawings.

DESCRIPTION OF THE PREFERRED EMBODIMENTS

Figure 3:
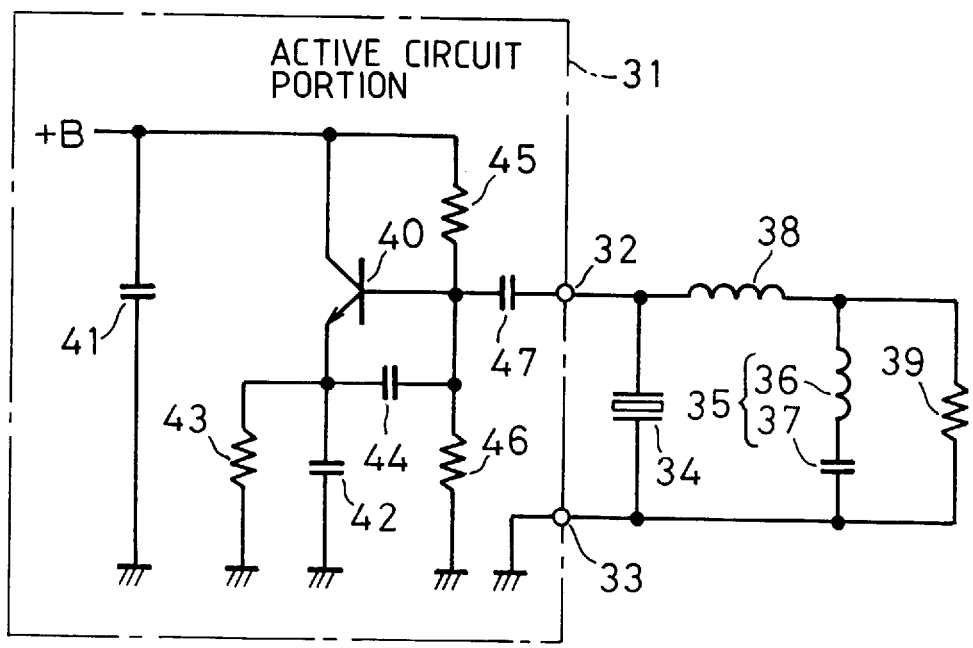
FIG. 3 is a circuit diagram showing a first embodiment of oscillation circuit according to the present invention.

FIG. 3 shows a first embodiment of oscillation circuit according to the present invention.

Figure 1:
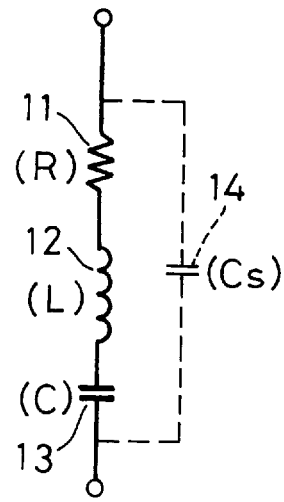
FIG. 1 is a circuit diagram showing an equivalent circuit representing a surface acoustic wave resonance device of the single port type.
Figure 2:
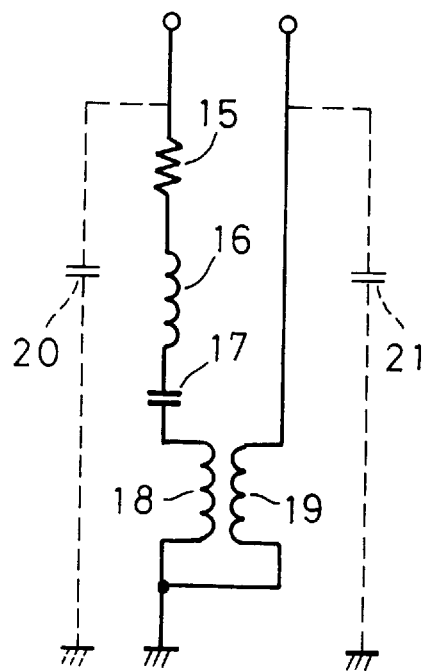
FIG. 2 is a circuit diagram showing an equivalent circuit representing a surface acoustic wave resonance device of the double port type.

Referring to FIG. 3, the first embodiment has a fundamental structure in which a surface acoustic wave resonance device 34 of the single port type, which is represented with such an equivalent circuit as shown in FIG. 1, is connected at its both ends with connecting terminals 32 and 33 of an active circuit portion 31. Further, in the first embodiment shown in FIG. 3, a series connection of an inductive element 36, a capacitive element 37 and an inductive element 38, in which the inductive element 36 and capacitive element 37 form a series resonance circuit portion 35 having a resonance frequency which is substantially equal to the resonance frequency of the surface acoustic wave resonance device 34, is connected in parallel with the surface acoustic wave resonance device 34, and a resistant element 39 which forms a damping portion is also connected in parallel with the series resonance circuit portion 35 and in series with the inductive element 38.

The active circuit portion 31 comprises a transistor 40 of the NPN type functioning as an active element to which a power source voltage +B is supplied. The collector of the transistor 40 is grounded through a capacitive element 41 and the emitter of the transistor 40 is grounded through a parallel connection of a capacitive element 42 and a resistant element 43. An emitter output signal obtained at the emitter of the transistor 40 is fed though a capacitive element 44 back to the base of the transistor 40. Resistors 45 and 46 form a bias circuit portion for biasing the base of the transistor 40.

The connecting terminal 32 with which one end of the surface acoustic wave resonance device 34 is connected is coupled through a capacitive element 47 with the base of the transistor 40 and the connecting terminal 33 with which the other end of the surface acoustic wave resonance device 34 is connected is grounded. Accordingly, the surface acoustic wave resonance device 34 is substantially connected between the base of the transistor 40 and the grounded potential point. The emitter output signal which is fed from the emitter of the transistor 40 though the capacitive element 44 back to the base of the transistor 40 is supplied through the capacitive element 47 to the surface acoustic wave resonance device 34. In such a manner as mentioned above, the active circuit portion 31 performs a signal feedback to the surface acoustic wave resonance device 34. In the active circuit portion 31, circuit parameters are so determined that an oscillating operation is raised when the surface acoustic wave resonance device 34 provides inductive impedance.

When the first embodiment thus constituted is put in a condition of oscillating operation in which a signal having a frequency in the vicinity of a resonance frequency of the surface acoustic wave resonance device 34 is fed from the active circuit portion 31 back to the-surface acoustic wave resonance device 34, the impedance provided by the series resonance circuit portion 35 which has the resonance frequency which is substantially equal to the resonance frequency of the surface acoustic wave resonance device 34 becomes substantially zero. Therefore, the circuit structure captured by means of observation from the active circuit portion 31 toward the surface acoustic wave resonance device 34 comprises substantially the surface acoustic wave resonance device 34 and the inductive element 38 connected in parallel with the surface acoustic wave resonance device 34 and other portions including the series resonance circuit portion 35 and the resistant element 39 are substantially neglected. Accordingly, stray capacitance accompanying the surface acoustic wave resonance device 34 is substantially cancelled by the inductive element 38 and thereby reduction in an effective value of a value Q indicating sharpness in resonance of the surface acoustic wave resonance device 34 is effectively prevented from being caused due to harmful influence of the stray capacitance.

Consequently, the resonance frequency of the surface acoustic wave resonance device 34, namely, the oscillation frequency of the first embodiment can be set to be a relatively high frequency, so that an oscillation output signal having a relatively high frequency, such as a frequency equal to or higher than, for example, 450 MHz can be obtained.

On the other hand, when the first embodiment is put in a condition in which the signal having the frequency in the vicinity of the resonance frequency of the surface acoustic wave resonance device 34 is not fed from the active circuit portion 31 back to the surface acoustic wave resonance device 34, the series resonance circuit portion 35 and the resistant element 39 can not be substantially neglected so that the resistant element 39 is connected in series with the inductive element 38 in the circuit structure captured by means of observation from the active circuit portion 31 toward the surface acoustic wave resonance device 34. Accordingly, parasitic oscillations arising at an undesirable resonance frequency determined by inductance of the inductive element 38 and the stray capacitance accompanying the surface acoustic wave resonance device 34 are effectively suppressed by the resistant element 39 providing damping effect. In such a situation, the resistant element 39 forms the damping portion which is operative to suppress the parasitic oscillations caused due to coaction between the inductive element 38 and the stray capacitance accompanying the surface acoustic wave resonance device 34.

As described above, in the first embodiment shown in FIG. 3, the inductive element 38 connected substantially in parallel with the surface acoustic wave resonance device 34 is operative to cancel substantially the stray capacitance accompanying the surface acoustic wave resonance device 34 under the condition of oscillating operation in which the signal feedback of the signal having the frequency in the vicinity of the resonance frequency of the surface acoustic wave resonance device 34 is carried out from the active circuit portion 31 to the surface acoustic wave resonance device 34, and the resistant element 39 connected in parallel with the series resonance circuit portion 35 and in series with the inductive element 38 is operative to suppress the undesirable parasitic oscillations under the condition in which the signal feedback of the signal having the frequency in the vicinity of the resonance frequency of the surface acoustic wave resonance device 34 is not carried out from the active circuit portion 31 to the surface acoustic wave resonance device 34. As a result, the oscillation output signal having the relatively high frequency, for example, the frequency equal to or higher than 450 MHz can be surely and stably obtained.

Figure 4:
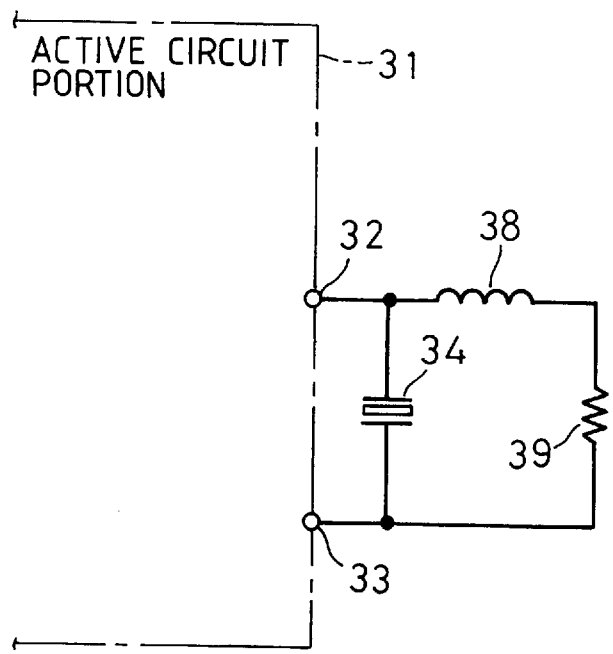
FIG. 4 is a circuit diagram showing a second embodiment of oscillation circuit according to the present invention with partial omissions thereof.

FIG. 4 shows a second embodiment of oscillation circuit according to the present invention. This second embodiment corresponds to a circuit obtained by eliminating the inductive element 36 and capacitive element 37 forming the series resonance circuit portion 35 from the first embodiment shown in FIG. 3. In FIG. 4, elements and parts corresponding to those shown in FIG. 3 are marked with the same references and further description thereof will be omitted.

Referring to FIG. 4, in the second embodiment, the circuit structure captured by means of observation from the active circuit portion 31 toward the surface acoustic wave resonance device 34 always comprises the surface acoustic wave resonance device 34 and a series connection of the inductive element 38 and the resistant element 39 connected in parallel with the surface acoustic wave resonance device 34 regardless of a signal feedback from the active circuit portion 31 to the surface acoustic wave resonance device 34.

The resistant element 39 is so selected as to have its resistance as small as possible within the range of value necessary for forming the damping portion which is operative to suppress effectively the undesirable parasitic oscillations caused due to the coaction between the inductive element 38 and the stray capacitance accompanying the surface acoustic wave resonance device 34 under a condition in which a signal feedback of a signal having a frequency in the vicinity of the resonance frequency of the surface acoustic wave resonance device 34 is not carried out from the active circuit portion 31 to the surface acoustic wave resonance device 34. Therefore, the stray capacitance accompanying the surface acoustic wave resonance device 34 is substantially cancelled by the inductive element 38 and thereby reduction in the effective value of the value Q indicating sharpness in resonance of the surface acoustic wave resonance device 34 is effectively prevented from being caused due to harmful influence of the stray capacitance under a condition of oscillating operation in which the signal feedback of the signal having the frequency in the vicinity of the resonance frequency of the surface acoustic wave resonance device 34 is carried out from the active circuit portion 31 to the surface acoustic wave resonance device 34.

Figure 5:
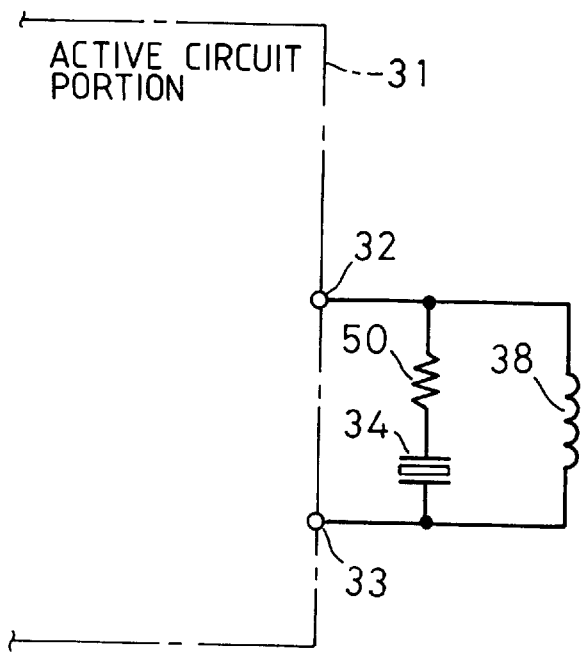
FIG. 5 is a circuit diagram showing a third embodiment of oscillation circuit according to the present invention with partial omissions thereof.

FIG. 5 shows a third embodiment of oscillation circuit according to the present invention. This third embodiment corresponds to a circuit obtained by eliminating the inductive element 36 and capacitive element 37 forming the series resonance circuit portion 35 from the first embodiment shown in FIG. 3 and by replacing the resistant element 39 employed in the first embodiment shown in FIG. 3 with a resistant element 50 connected in series with the surface acoustic wave resonance device 34. In FIG. 5, elements and parts corresponding to those shown in FIG. 3 are marked with the same references and further description thereof will be omitted.

Referring to FIG. 5, in the third embodiment, both ends of a series connection of the resistant element 50 and the surface acoustic wave resonance device 34 are coupled with the connecting terminals 32 and 33 of the active circuit portion 31, respectively. The inductive element 38 is connected in parallel with the series connection of the resistant element 50 and the surface acoustic wave resonance device 34.

The circuit structure captured by means of observation from the active circuit portion 31 toward the surface acoustic wave resonance device 34 always comprises the surface acoustic wave resonance device 34, the resistant element 50 connected in series with the surface acoustic wave resonance device 34 and the inductive element 38 connected in parallel with the series connection of the resistant element 50 and the surface acoustic wave resonance device 34 regardless of a signal feedback from the active circuit portion 31 to the surface acoustic wave resonance device 34.

In the third embodiment thus constituted, the parasitic oscillations arising at an undesirable resonance frequency determined by inductance of the inductive element 38 and the stray capacitance accompanying the surface acoustic wave resonance device 34 are effectively suppressed by the resistant element 50 providing damping effect under a condition in which a signal feedback of a signal having a frequency in the vicinity of the resonance frequency of the surface acoustic wave resonance device 34 is not carried out from the active circuit portion 31 to the surface acoustic wave resonance device 34. In such a situation, the resistant element 50 forms a damping portion which is operative to suppress the parasitic oscillations caused due to coaction between the inductive element 38 and the stray capacitance accompanying the surface acoustic wave resonance device 34.

The resistant element 50 is so selected as to have its resistance as small as possible within the range of value necessary for forming the damping portion which is operative to suppress effectively the undesirable parasitic oscillations caused due to the coaction between the inductive element 38 and the stray capacitance accompanying the surface acoustic wave resonance device 34 under the condition in which the signal feedback of the signal having the frequency in the vicinity of the resonance frequency of the surface acoustic wave resonance device 34 is not carried out from the active circuit portion 31 to the surface acoustic wave resonance device 34. Therefore, the stray capacitance accompanying the surface acoustic wave resonance device 34 is substantially cancelled by the inductive element 38 and thereby reduction in the effective value of the value Q indicating sharpness in resonance of the surface acoustic wave resonance device 34 is effectively prevented from being caused due to harmful influence of the stray capacitance under a condition of oscillating operation in which the signal feedback of the signal having the frequency in the vicinity of the resonance frequency of the surface acoustic wave resonance device 34 is carried out from the active circuit portion 31 to the surface acoustic wave resonance device 34.

Figure 6:
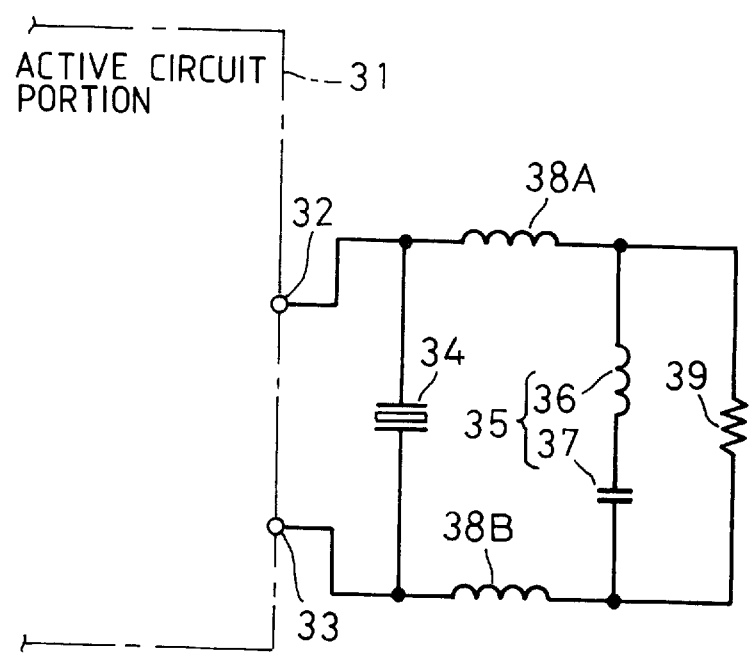
FIG. 6 is a circuit diagram showing a fourth embodiment of oscillation circuit according to the present invention with partial omissions thereof.

FIG. 6 shows a fourth embodiment of oscillation circuit according to the present invention. This fourth embodiment corresponds to a circuit obtained by replacing the inductive element 38 employed in the first embodiment shown in FIG. 3 with a pair of inductive elements 38A and 38B. In FIG. 6, elements and parts corresponding to those shown in FIG. 3 are marked with the same references and further description thereof will be omitted.

Referring to FIG. 6, in the fourth embodiment, the inductive element 38A has one end coupled with the connecting terminal 32 of the active circuit portion 31 and is connected in series with each of the resistant element 39 and the series resonance circuit portion 35 comprising the inductive element 36 and the capacitive element 37, and the inductive element 38B has one end coupled with the connecting terminal 33 of the active circuit portion 31 and is connected in series with each of the resistant element 39 and the series resonance circuit portion 35 comprising the inductive element 36 and the capacitive element 37. The fourth embodiment thus constituted with the inductive elements 38A and 38B connected as mentioned above has a balanced configuration in its entirety. Accordingly, stray capacitance is balanced in relation to the ground potential point in the circuit structure captured by means of observation from the active circuit portion 31 toward the surface acoustic wave resonance device 34 and thereby a leakage part of oscillation output signal is effectively reduced.

The inductive elements 38A and 38B are operative to function in the same manner as the inductive element 38 employed in the first embodiment shown in FIG. 3 under a condition of oscillating operation in which a signal feedback of a signal having a frequency in the vicinity of the resonance frequency of the surface acoustic wave resonance device 34 is carried out from the active circuit portion 31 to the surface acoustic wave resonance device 34. Therefore, such advantageous operation and effect as those provided by the first embodiment shown in FIG. 3 are obtained in the fourth embodiment shown in FIG. 6.

Figure 7:
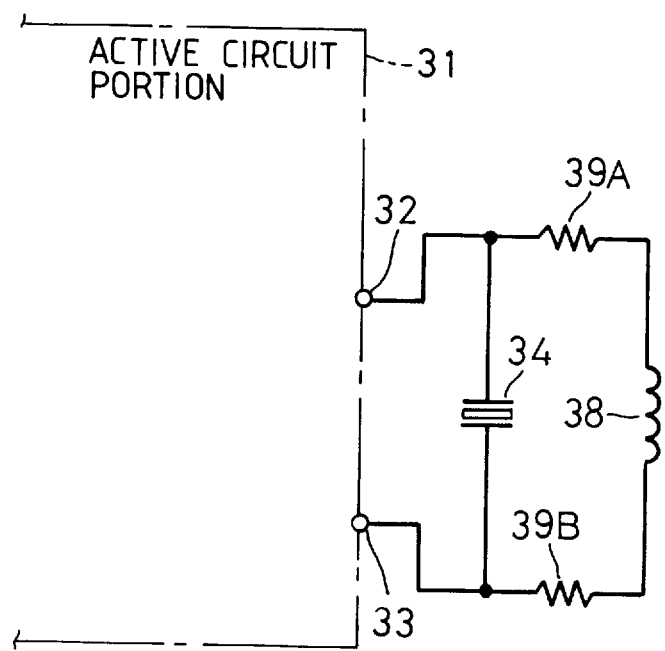
FIG. 7 is a circuit diagram showing a fifth embodiment of oscillation circuit according to the present invention with partial omissions thereof.

FIG. 7 shows a fifth embodiment of oscillation circuit according to the present invention. This fifth embodiment corresponds to a circuit obtained by replacing the resistant element 39 employed in the second embodiment shown in FIG. 4 with a pair of resistant elements 39A and 39B. In FIG. 7, elements and parts corresponding to those shown in FIG. 3 are marked with the same references and further description thereof will be omitted.

Referring to FIG. 7, in the fifth embodiment, the resistant element 39A has one end coupled with the connecting terminal 32 of the active circuit portion 31 and is connected in series with the inductive element 38, and the resistant element 39B has one end coupled with the connecting terminal 33 of the active circuit portion 31 and is connected in series with the inductive element 38. The fifth embodiment thus constituted with the resistant elements 39A and 39B connected as mentioned above has a balanced configuration in its entirety. Accordingly, stray capacitance is balanced in relation to the ground potential point in the circuit structure captured by means of observation from the active circuit portion 31 toward the surface acoustic wave resonance device 34 and thereby a leakage part of oscillation output signal is effectively reduced.

The resistant elements 39A and 39B are operative to function as a damping portion in the same manner as the resistant element 39 employed in the second embodiment shown in FIG. 4 under a condition of oscillating operation in which a signal feedback of a signal having a frequency in the vicinity of the resonance frequency of the surface acoustic wave resonance device 34 is not carried out from the active circuit portion 31 to the surface acoustic wave resonance device 34. Therefore, such advantageous operation and effect as those provided by the second embodiment shown in FIG. 4 are obtained in the fifth embodiment shown in FIG. 7.

Figure 8:
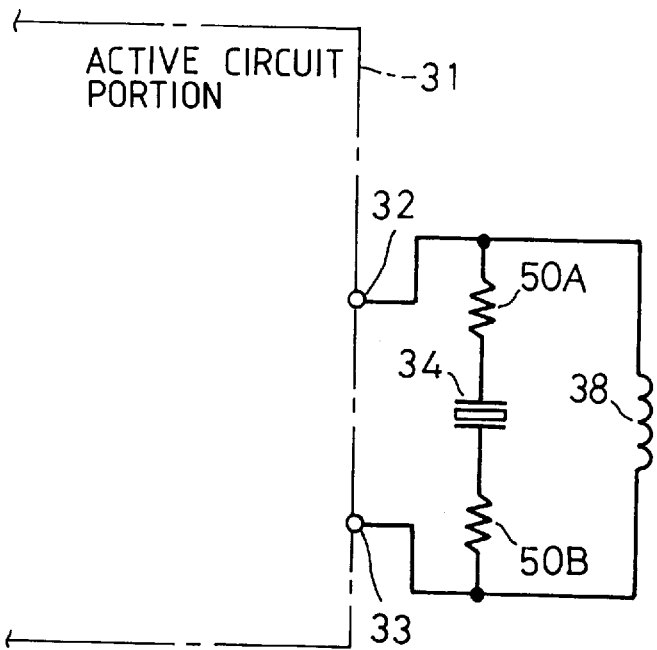
FIG. 8 is a circuit diagram showing a sixth embodiment of oscillation circuit according to the present invention with partial omissions thereof.

FIG. 8 shows a sixth embodiment of oscillation circuit according to the present invention. This sixth embodiment corresponds to a circuit obtained by replacing the resistant element 50 employed in the third embodiment shown in FIG. 5 with a pair of resistant elements 50A and 50B. In FIG. 8, elements and parts corresponding to those shown in FIG. 3 are marked with the same references and further description thereof will be omitted.

Referring to FIG. 8, in the sixth embodiment, the resistant element 50A has one end coupled with the connecting terminal 32 of the active circuit portion 31 and is connected in series with the surface acoustic wave resonance device 34, and the resistant element 50B has one end coupled with the connecting terminal 33 of the active circuit portion 31 and is connected in series with the surface acoustic wave resonance device 34. The sixth embodiment thus constituted with the resistant elements 50A and 50B connected as mentioned above has a balanced configuration in its entirety. Accordingly, stray capacitance is balanced in relation to the ground potential point in the circuit structure captured by means of observation from the active circuit portion 31 toward the surface acoustic wave resonance device 34 and thereby a leakage part of oscillation output signal is effectively reduced.

The resistant elements 50A and 50B are operative to function as a damping portion in the same manner as the resistant element 50 employed in the third embodiment shown in FIG. 5 under a condition of oscillating operation in which a signal feedback of a signal having a frequency in the vicinity of the resonance frequency of the surface acoustic wave resonance device 34 is not carried out from the active circuit portion 31 to the surface acoustic wave resonance device 34. Therefore, such advantageous operation and effect as those provided by the third embodiment shown in FIG. 5 are obtained in the sixth embodiment shown in FIG. 8.

The surface acoustic wave resonance device 34 of the single port type employed in each of the first to sixth embodiments is represented with the equivalent circuit shown in FIG. 1. Accordingly, if the stray capacitance accompanying the surface acoustic wave resonance device 34 is so small as to be substantially negligible, the circuit structure in which both ends of the surface acoustic wave resonance device 34 are coupled with the connecting terminals 32 and 33 of the active circuit portion 31, respectively, is equivalently represented with a circuit structure in which both ends of a series connection 55 of a resistant element 51, an inductive element 52 and a capacitive element 53 are coupled with the connecting terminals 32 and 33 of the active circuit portion 31, respectively, as shown in FIG. 9.

Figure 9:
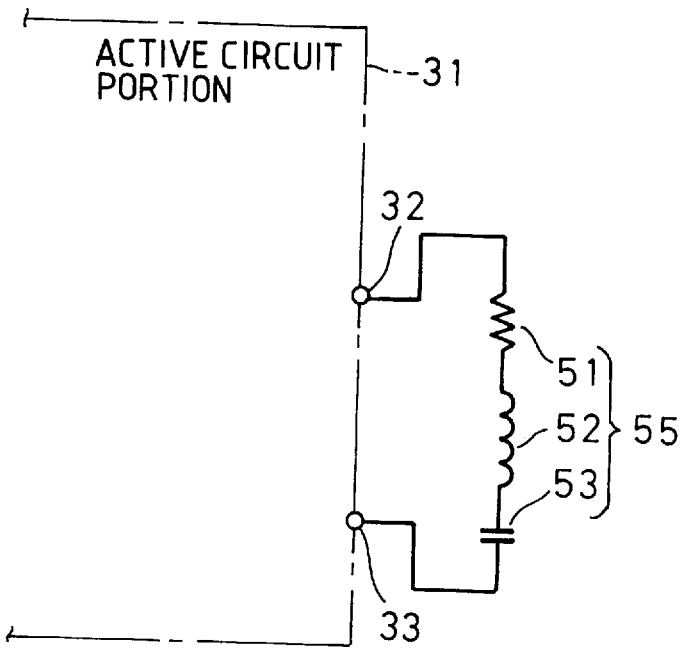
FIG. 9 is a circuit diagram showing an equivalent circuit chart used for explaining a surface acoustic wave resonance device of the single port type employed in the embodiment shown in anyone of FIGS. 1 to 6.
Figure 10:
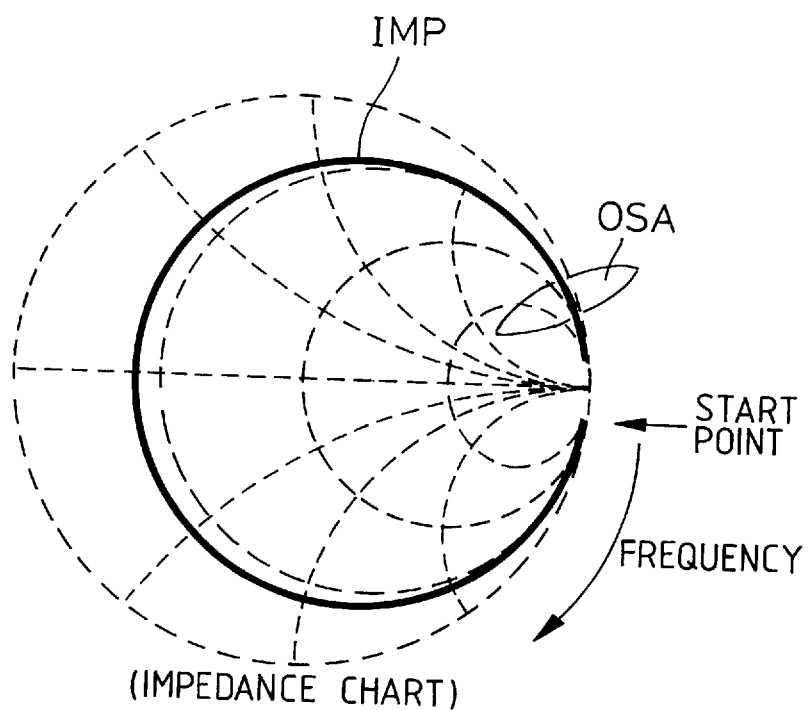
FIG. 10 is a Smith chart used for explaining the surface acoustic wave resonance device of the single port type employed in the embodiment shown in anyone of FIGS. 1 to 6.

The circuit structure shown in FIG. 9 provides an oscillating region OSA on the Smith chart (impedance chart) as shown in FIG. 10 under the condition in which the circuit parameters in the active circuit portion 31 are so determined that the oscillating operation is raised when the surface acoustic wave resonance device 34 provides inductive impedance. On the Smith chart shown in FIG. 10, the impedance of a resonance portion connected with the active circuit portion 31, to which a signal having a frequency in the vicinity of the resonance frequency of the resonance portion is fed back from the active circuit portion 31, is obtained along a locus IMP.

Accordingly, in the case of the circuit structure shown in FIG. 9, the oscillation frequency is determined to be a frequency corresponding to a portion of the locus IMP within the oscillating region OSA on the Smith chart shown in FIG. 10. The resonance impedance of the series connection 55 is shown at the position relatively close to the outside of the Smith chart. This means that the equivalent resistance provided substantially in parallel with the resonance portion connected with the active circuit portion 31 is relatively large.

Figure 11:
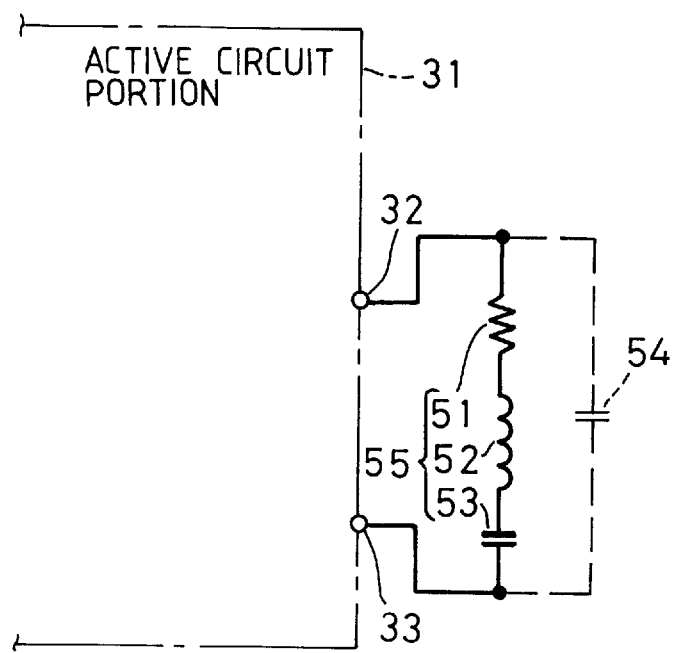
FIG. 11 is a circuit diagram showing an equivalent circuit chart used for explaining the surface acoustic wave resonance device of the single port type employed in the embodiment shown in anyone of FIGS. 1 to 6.

In practice, since the stray capacitance accompanying the surface acoustic wave resonance device 34 can not be neglected, the circuit structure in which both ends of the surface acoustic wave resonance device 34 are coupled with the connecting terminals 32 and 33 of the active circuit portion 31, respectively, is equivalently represented with a circuit structure in which both ends of the series connection 55 of the resistant element 51, the inductive element 52 and the capacitive element 53 are coupled with the connecting terminals 32 and 33 of the active circuit portion 31, respectively, and further a capacitive element 54 corresponding to the stray capacitance is connected in parallel with the series connection 55, as shown in FIG. 11.

Figure 12:
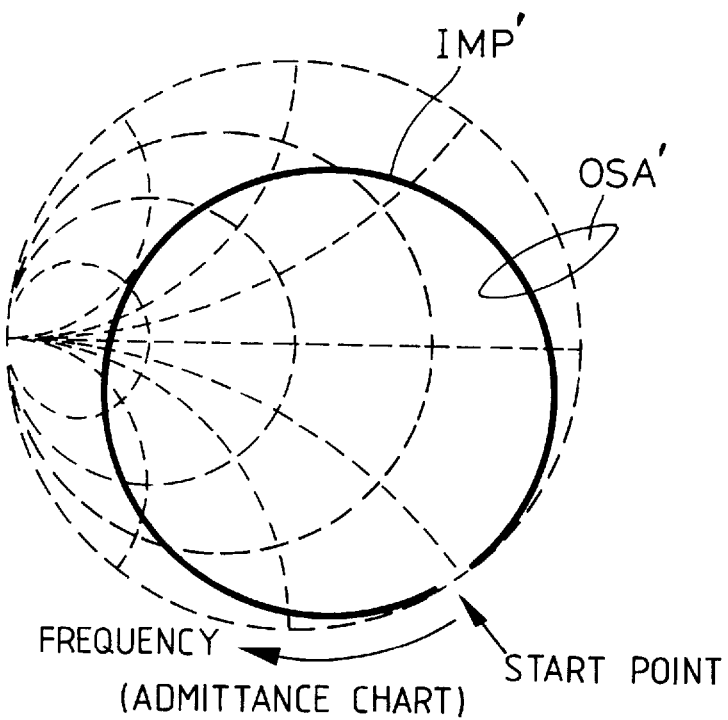
FIG. 12 is a Smith chart used for explaining the surface acoustic wave resonance device of the single port type employed in the embodiment shown in anyone of FIGS. 1 to 6.

The circuit structure shown in FIG. 11 provides an oscillating region OSA' on the Smith chart (admittance chart) as shown in FIG. 12 under the condition in which the circuit parameters in the active circuit portion 31 are so determined that the oscillating operation is raised when the surface acoustic wave resonance device 34 provides inductive impedance. On the Smith chart shown in FIG. 12, the impedance of a resonance portion connected with the active circuit portion 31, to which a signal having a frequency in the vicinity of the resonance frequency of the resonance portion is fed back from the active circuit portion 31, is obtained along a locus IMP' which is accompanied with the shift of the start point thereof resulting from the capacitive element 54, compared with the locus IMP on the Smith chart shown in FIG. 10.

In the case of the circuit structure shown in FIG. 11, the oscillation frequency is determined to be a frequency corresponding to a portion of the locus IMP' within the oscillating region OSA' on the Smith chart shown in FIG. 12. The resonance impedance of the parallel connection of the series connection 55 and the capacitive element 54 is shown at the position shifted toward the inside of the Smith chart, compared with the resonance impedance of the series connection 55 shown in FIG. 9. This means that reduction in the conductance of the resonance portion connected with the active circuit portion 31, namely, reduction in the equivalent resistance provided substantially in parallel with the resonance portion connected with the active circuit portion 31 is brought about when the circuit structure shown in FIG. 11 is put in the oscillating operation.

In each of the embodiments shown in FIGS. 3 to 8 and described above, the inductive element 38 or the inductive elements 38A and 38B, which are operative to cancel substantially the stray capacitance accompanying the surface acoustic wave resonance device 34 under the condition of oscillating operation in which the signal feedback of the signal having the frequency in the vicinity of the resonance frequency of the surface acoustic wave resonance device 34 is carried out from the active circuit portion 31 to the surface acoustic wave resonance device 34, and the resistant element 39, the resistant elements 39A and 39B or the resistant elements 50A and 50B, which are operative to suppress effectively the undesirable parasitic oscillations under the condition in which the signal feedback of the signal having the frequency in the vicinity of the resonance frequency of the surface acoustic wave resonance device 34 is not carried out from the active circuit portion 31 to the surface acoustic wave resonance device 34, are provided for avoiding disadvantages resulting from the capacitive element 54 shown in FIG. 11, namely, the stray capacitance accompanying the surface acoustic wave resonance device 34.

Further, each of the embodiments shown in FIGS. 3 to 8 and described above has the relatively simple fundamental structure which comprises the active circuit portion 31 and the surface acoustic wave resonance device 34 of the single port type connected with the active circuit portion 31 and does not require an expensive package capable of reducing stray capacitance for packaging the surface acoustic wave resonance device 34. Therefore, the embodiment shown in anyone of FIGS. 3 to 8 is suitable for being associated with an integrated circuit device and able to be cheaply obtained. Especially, each of the embodiments shown in FIGS. 4 to 6, in which the circuit structure coupled with the connecting terminals 32 and 33 of the active circuit portion 31 has the balanced configuration in its entirety, is fit for the integrated circuit device.

What is claimed is:

1. An oscillation circuit comprising:

a surface acoustic wave resonance device of a single port type;

an active circuit portion with which said surface acoustic wave resonance device is connected so that a signal feedback from said active circuit portion to said surface acoustic wave resonance device is carried out;

inductive means coupled to said surface acoustic wave resonance device;

series resonance circuit means having a resonance frequency substantially equal to a resonance frequency of said surface acoustic wave resonance device and coupled to said inductive means; and damping means connected with at least one of said inductive means and said surface acoustic wave resonance device for suppressing parasitic oscillations caused by coaction between said inductive means and stray capacitance accompanying said surface acoustic wave resonance device, wherein said damping means comprises resistant means in which said resistant means and said series resonance circuit means are arranged to form a parallel circuit and in which said parallel circuit is connected in series with said inductive means.

2. An oscillation circuit comprising:

a surface acoustic wave resonance device of a single port type;

an active circuit portion with which said surface acoustic wave resonance device is connected so that a signal feedback from said active circuit portion to said surface acoustic wave resonance device is carried out;

inductive means connected substantially in parallel with said surface acoustic wave resonance device; and damping means connected with at least one of said inductive means and said surface acoustic wave resonance device for suppressing parasitic oscillations caused by coaction between said inductive means and stray capacitance accompanying said surface acoustic wave resonance device, wherein said damping means comprises first and second resistant means connected in series with said surface acoustic wave resonance device such that the stray capacitance is balanced in relation to a ground potential point and said inductive means is connected in parallel with a series connection of said surface acoustic wave resonance device and said first and second resistant means.

3. An oscillation circuit comprising:

a surface acoustic wave resonance device of a single port type;

an active circuit portion with which said surface acoustic wave resonance device is connected so that a signal feedback from said active circuit portion to said surface acoustic wave resonance device is carried out;

inductive means connected substantially in parallel with said surface acoustic wave resonance device; and damping means connected with at least one of said inductive means and said surface acoustic wave resonance device for suppressing parasitic oscillations caused by coaction between said inductive means and stray capacitance accompanying said surface acoustic wave resonance device, wherein said damping means comprises resistant means connected in series with said inductive means, and wherein said resistant means comprises first and second resistant elements and a series connection of said first resistant element, said inductive means and said second resistant element is connected in parallel with said surface acoustic wave resonance device.

4. An oscillation circuit according to claim 1, wherein said inductive means comprises first and second inductive elements which are arranged such that said first inductive element is coupled to one end of said surface acoustic wave resonance device and said parallel circuit and said second inductive element is coupled to another end of said surface acoustic wave resonance device and said parallel circuit.

* * * * *